(12) United States Patent
Jennings et al.

(10) Patent No.: US 7,795,816 B2
(45) Date of Patent: Sep. 14, 2010

(54) HIGH SPEED PHASE SCRAMBLING OF A COHERENT BEAM USING PLASMA

(75) Inventors: Dean Jennings, Beverly, MA (US); Bruce E. Adams, Portland, OR (US); Timothy N. Thomas, Portland, OR (US); Stephen Moffatt, Millbrook, St. Lawrence (GB)

(73) Assignee: Applied Materials, Inc., Santa Clara, CA (US)

( * ) Notice: Subject to any disclaimer, the term of this patent is extended or adjusted under 35 U.S.C. 154(b) by 253 days.

(21) Appl. No.: 11/868,933

(22) Filed: Oct. 8, 2007

(65) Prior Publication Data

US 2009/0091817 A1    Apr. 9, 2009

(51) Int. Cl.
*H05B 31/26* (2006.01)
(52) U.S. Cl. .................................. 315/111.21
(58) Field of Classification Search .................. 359/253, 359/254, 257; 250/282, 288, 305, 306, 504 R, 250/423 R, 493.1, 492.2; 315/111.01, 111.11, 315/111.21, 111.41, 111.71, 111.81, 111.91
See application file for complete search history.

(56) References Cited

U.S. PATENT DOCUMENTS

| 4,007,430 | A |   | 2/1977 | Fletcher et al. |
| 4,116,542 | A |   | 9/1978 | Moncur et al. |
| 5,048,163 | A |   | 9/1991 | Asmus et al. |
| 7,087,914 | B2 |  | 8/2006 | Akins et al. |
| 7,396,431 | B2 | * | 7/2008 | Chen et al. ............. 156/345.33 |

OTHER PUBLICATIONS

PCT Search Report, International Application No. PCT/US2008/078704; date Mar. 10, 2008; pp. 1-10.

* cited by examiner

*Primary Examiner*—Timothy J Thompson
*Assistant Examiner*—Tuyen Q Tra
(74) *Attorney, Agent, or Firm*—Patterson & Sheridan, LLP

(57) ABSTRACT

A laser beam is modulated at a very high frequency to produce uniform radiant flux densities on substrate surface processing regions during thermal processing. Beam modulation is achieved by passing the laser beam through a plasma which causes phase randomization within the laser beam. This method may be used for any application where intense, uniform illumination is desired, such as pulsed laser annealing, ablating, and wafer stepper illuminating.

17 Claims, 12 Drawing Sheets

HIGH SPEED PHASE SCRAMBLING OF A COHERENT BEAM USING PLASMA

BACKGROUND OF THE INVENTION

1. Field of the Invention

Embodiments of the present invention generally relate to coherent light sources such as lasers. In particular, the invention is directed to a method and apparatus for providing intense and uniform illumination during short time intervals using a pulsed coherent light source.

2. Description of the Related Art

The integrated circuit (IC) market is continually demanding greater memory capacity, faster switching speeds, and smaller feature sizes. One of the major steps the industry has taken to address these demands is to change from batch processing silicon wafers in large furnaces to single wafer processing in a small chamber.

During such single wafer processing the wafer is typically heated to high temperatures so that various chemical and physical reactions can take place in multiple IC devices defined in the wafer. Of particular interest, favorable electrical performance of the IC devices requires implanted regions to be annealed. Annealing recreates a more crystalline structure from regions of the wafer that were previously made amorphous, and activates dopants by incorporating their atoms into the crystalline lattice of the substrate, or wafer. Thermal processes, such as annealing, require providing a relatively large amount of thermal energy to the wafer in a short amount of time, and thereafter rapidly cooling the wafer to terminate the thermal process. Examples of thermal processes currently in use include Rapid Thermal Processing (RTP) and impulse (spike) annealing.

A drawback of RTP processes is that they heat the entire wafer even though the IC devices typically reside only in the top few microns of the silicon wafer. This limits how fast one can heat up and cool down the wafer. Moreover, once the entire wafer is at an elevated temperature, heat can only dissipate into the surrounding space or structures. As a result, today's state of the art RTP systems struggle to achieve a 400° C./s ramp-up rate and a 150° C./s ramp-down rate. While RTP and spike annealing processes are widely used, current technology is not ideal, and tends to ramp the wafer temperature during thermal processing too slowly and thus expose the wafer to elevated temperatures for too long a period of time. These thermal budget type problems become more severe with increasing wafer sizes, increasing switching speeds, and/or decreasing feature sizes.

To resolve some of the problems raised in conventional RTP type processes various scanning laser anneal techniques have been used to anneal the surface(s) of the substrate. In general, these techniques deliver a constant energy flux to a small region on the surface of the substrate while the substrate is translated, or scanned, relative to the energy delivered to the small region. Due to the stringent uniformity requirements and the complexity of minimizing the overlap of scanned regions across the substrate surface these types of processes are not effective for thermal processing contact level devices formed on the surface of the substrate.

Pulsed laser annealing techniques have been used to anneal finite regions on the surface of the substrate to provide well defined annealed and/or re-melted regions on the surface of the substrate. In general, during a pulsed laser anneal process various regions on the surface of the substrate are exposed to a desired amount of energy delivered from the laser to cause the preferential heating of desired regions of the substrate. Pulsed laser annealing techniques have an advantage over conventional processes that sweep the laser energy across the surface of the substrate, since the need to tightly control the overlap between adjacently scanned regions to assure uniform annealing across the desired regions of the substrate is not an issue, since the overlap of the exposed regions of the substrate is typically limited to the unused space between die, or "kerf" lines.

Due to the shrinking semiconductor device sizes and stringent device processing characteristics the tolerance in the variation in the amount of energy delivered during each pulse to different devices formed on the substrate surface is very low. These device requirements have made the tolerance to variations in the delivered energy across the exposed surface of the substrate to be rather small (i.e., <5% variation). However, the use of a coherent light source, such as a laser, can introduce coherence effects, such as speckle and diffraction fringes, which can cause non-uniformities in the radiant energy which is incident on a small region of the substrate surface.

Various optical devices may be interposed between the laser source and the substrate to modify the beam for a particular laser annealing application. Such devices may include optical steering systems, pulse stretchers, beam spreaders, beam homogenizers, and other devices. As the coherent laser light passes through such devices, the light may scatter from rough surfaces or inhomogeneous media producing many coherent wavefronts which emit from the scattering sites and are subject to phase differences and/or intensity fluctuations. The coherent wavefronts may interfere to produce a random intensity pattern characterized by many small bright and dark points or spots, where the bright spots correspond to scattered waves that have interfered constructively and the dark spots to waves that have interfered destructively. Such an intensity pattern is also known as speckle and is a common phenomenon when coherent light is scattered from rough surfaces or inhomogeneous media. In addition to speckle, diffraction fringes may also be formed when the laser light passes by opaque objects or through apertures and lenses, for example.

To produce more uniform illumination or radiant flux density at the surface of the substrate during laser annealing, it is desirable to eliminate or minimize coherence effects such as speckle and diffraction fringes. One such method is to use rotating diffusers which have the effect of integrating multiple speckle patterns to produce a more uniform radiant flux at the surface of a target area. However, this approach is effective only if the rotation speed is significantly faster than the process integration time of interest. For example, if the process time is represented by a 50 nanosecond (ns) pulse width (also referred to as pulse duration) for a pulsed laser and a rotating diffuser has a rotation frequency on the kHz timescale, the rotating diffuser will be "strobed" by the laser and the substrate "will see" a speckle pattern. The use of a pulsed laser requires that coherence effects be removed well within the pulse width of the laser. In general, the use of mechanical motion of lenses and/or diffusers for eliminating coherence effects over nanosecond timescales is impractical.

Therefore, there is a need for a method and apparatus which reduces coherence effects, such as speckle and diffraction fringes, over short timescales and provides more uniform illumination at the substrate surface during laser annealing.

SUMMARY OF THE INVENTION

Embodiments of the present invention reduce coherence effects of a laser beam to provide intense and uniform illumination on a substrate during laser annealing. The laser beam is spatially modulated at a very high frequency by passing the laser beam through a plasma.

One embodiment of the present invention provides an apparatus for reducing coherence effects of a coherent light beam. The apparatus includes an enclosure having a first lens for focusing a coherent light beam and a second lens for collimating the light beam, wherein the enclosure is adapted to contain a gas for plasma formation. The coherent light beam ionizes the gas to produce a plasma which modulates the light beam.

Another embodiment of the present invention provides an apparatus for reducing coherence effects of a coherent light beam. The apparatus includes an enclosure having a first optical element and a second optical element for transmitting the light beam through the enclosure, and a plasma source for providing a plasma inside the enclosure. The enclosure is adapted to contain a gas for plasma formation. The coherent light beam is passed through the plasma which modulates the beam.

Another embodiment of the present invention provides a method for reducing coherence effects of a coherent light beam. The method generally includes providing an enclosure having a first optical element and second optical element and containing a gas, receiving the coherent light beam at the first optical element, forming a plasma from the gas, passing the coherent light beam through the plasma, modulating the coherent light beam, and receiving the modulated light beam at the second optical element.

In another embodiment of the present invention, a thermal processing system is provided for reducing coherence effects of a coherent light beam. The system includes a laser source for providing coherent light, a plasma-generating module through which the coherent light passes, and a thermal treatment chamber for housing substrates to be treated using the coherent light that passes through the plasma-generating module.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that features of one embodiment may be incorporated in other embodiments without further recitation.

DETAILED DESCRIPTION

Embodiments of the invention reduce coherence effects of a laser beam on a substrate by spatially modulating or "dithering" the laser beam at a very high frequency. In this context, the term dithering refers to randomizing the path of a light beam on a small scale. The very high frequency dithering of the laser beam is accomplished by passing the laser beam through a plasma.

Figure 1:
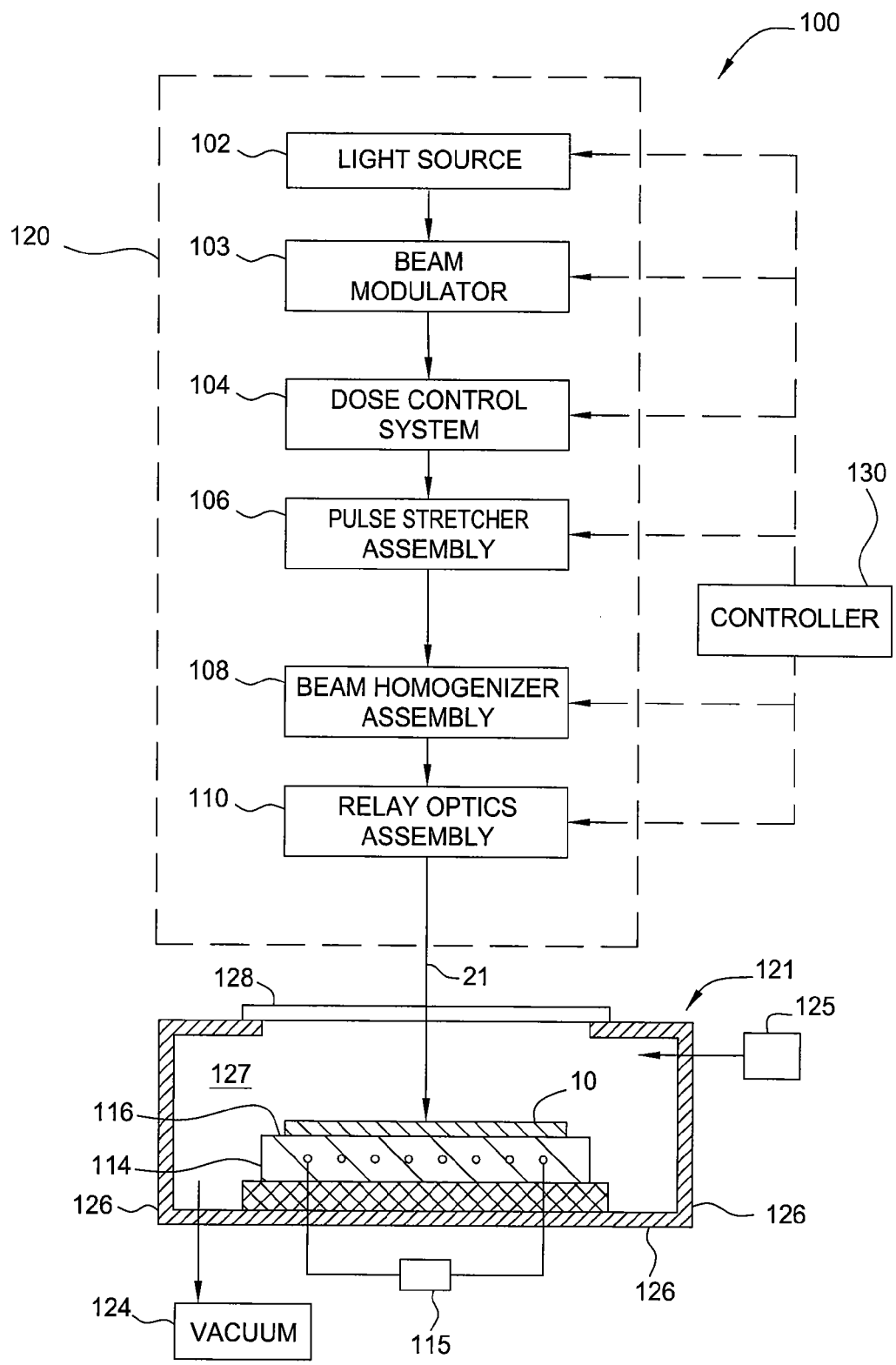
FIG. 1 is a schematic view of a laser anneal system according to an embodiment of the present invention.

FIG. 1 schematically illustrates a laser anneal system 100. The laser anneal system 100 includes a laser anneal processing chamber 121, a system controller 130, and an optical system 120 which produces a modulated light beam 21. The laser anneal processing chamber 121 may contain an enclosed processing region 127 that has one or more chamber walls 126 and an optically transparent window 128. The laser anneal processing chamber 121 may also contain a substrate support 114 and substrate supporting surface 116 for supporting a substrate 10.

Since the modulated light beam 21 is substantially smaller in cross-sectional area than the surface of substrate 10, substrate support 114 may be adapted to translate substrate 10 relative to modulated light beam 21 so that all surfaces of substrate 10 may be processed with modulated light beam 21. It is also contemplated that the beam may be moved relative to the substrate support 114, or that both the modulated light beam 21 and substrate support 114 move so that modulated beam 21 may be scanned across a predetermined anneal region at the surface of the substrate 10.

During processing, the processing region 127 may be evacuated by use of vacuum pump 124 and/or purged using an inert gas source 125 to reduce the partial pressure of undesirable gases, such as oxygen. Further, it may be desirable to control the temperature of the substrate during thermal processing by placing a surface of the substrate 10 in thermal contact with a substrate supporting surface 116 of the substrate support 114 and a heat exchanging device 115. The heat exchanging device 115 is generally adapted to heat and/or cool the substrate support 114 and substrate 10 prior to, during, or after the annealing process.

A system controller 130 is generally adapted to control the various components contained within the optical system 120 and the laser anneal processing chamber 121, which are discussed herein. The system controller 130 is generally designed to facilitate the control and automation of the thermal processing techniques described herein and typically may include a central processing unit (CPU) (not shown), memory (not shown), and support circuits (or I/O) (not shown). Software instructions and data can be coded and stored within the memory for instructing the CPU. A program (or computer instructions) readable by the controller determines which tasks are performable on a substrate. Preferably, the program is software readable by the controller and includes code to monitor and control the substrate supports position relative to the output of the laser, the amount of energy delivered in each laser pulse, the timing of one or more laser pulses, the intensity as a function of time for each pulse, the temperature of the substrate, the wavelength of each pulse delivered from each laser source to the substrate, and any combination thereof.

FIG. 1 also schematically illustrates an optical system 120, which includes a light source 102 (e.g., a pulsed laser), a beam modulator 103, a dose control system 104, a pulse stretcher assembly 106, a beam homogenizer assembly 108, and a relay optics assembly 110. The optical system 120 may be adapted to deliver, or project a uniform amount of energy, or "image," having a desired two-dimensional shape across the anneal regions on the surface of the substrate 10 to preferentially anneal and/or melt desired areas within these regions.

The amount of energy required to perform the laser anneal process on a semiconductor substrate described herein can be quite large. For example, the dose of energy delivered from the light source 102 may be between about 1 and about 10 Joules over an 8 to 10 nanosecond (ns) pulse duration, which is equivalent to delivering an average total power of between about 100 MW to about 1,250 MW in each pulse to the anneal region. If the anneal regions have an area of between about 4 $mm^2$ and about 1000 $mm^2$ the average energy density will be between about 0.1 $MW/mm^2$ and about 313 $MW/mm^2$. It should be noted that the instantaneous power delivered at any time during each pulse may be much higher or lower than the average due to variations in the profile of the energy pulse.

The light source 102 is generally adapted to deliver electromagnetic energy that is used to perform the pulse laser anneal process. Since the effectiveness of the laser anneal process is dependent on the transmission, absorption and reflection of the energy delivered from the light source 102 by the material to be annealed, the wavelength ($\lambda$) or wavelengths, of the delivered energy may be tuned so that they deliver a desired amount of energy to a desired depth within the substrate. It should be noted that the amount of energy delivered by each photon of light also varies as a function of wavelength ($E=hc/\lambda$), and thus the shorter the wavelength the greater the energy delivered by each photon of light. However, in some cases the substrate material, such as silicon, has an absorption edge that varies with thickness and wavelength, which limit the wavelengths that are absorbed by the substrate material. Therefore, depending on the thickness and type of material from which the substrate is made, the wavelength(s) of the emitted radiation may be varied to achieve the desired energy transfer to the substrate to minimize damage and promote uniform heating of the exposed region of the substrate.

The light source 102 may be adapted to deliver energy at a wavelength less than about 1064 nm, for example, to a primarily silicon containing substrate. In another example, the laser annealing processes may be performed on a silicon containing substrate using radiation that is delivered at wavelengths that are less than about 800 nanometers (nm). Alternatively, the wavelength of the optical energy delivered from the light source 102 may be about 532 nm to the primarily silicon containing substrate. In another example, the wavelength of the optical energy delivered from the energy source is about 216 nm or about 193 nm to the primarily silicon containing substrate. In a further example, light source 102 may include a Nd:YAG (neodymium-doped yttrium aluminium garnet) laser adapted to deliver energy at a wavelength between about 266 nm and about 1064 nm is used.

Generally, current commercial lasers are not able to deliver energies near the high end of the desired pulse laser anneal energy level (e.g., >2 Joules) and thus, in one embodiment, the light source 102 comprises multiple lasers the outputs of which are combined to deliver a desired amount of energy to the surface of the substrate. However, damage to the substrate can occur if the characteristics of the energy pulse used in the annealing process are not optimized or controlled. Typically, energy pulse characteristics may include but are not limited to the total amount of energy, the energy flux, the energy density, and/or the duration of the pulse. If the energy pulse characteristics are not optimized, damage to the substrate is generally created by the stress induced due to the rapid heating of the melted regions on the surface of the substrate. The rapid heating can generate acoustic shock waves in the substrate that can cause cracks, induce stress, and otherwise damage various regions of the substrate.

In one example, the light source 102 is adapted to deliver energy between about 1 and 10 joules at a pulse width between about 6 ns and about 80 ns at a desired wavelength, such as 532 nm. In another example, the light source 102 may be adapted to deliver energy between about 1 and 10 joules at a pulse width between about 20 ns and about 30 ns at a desired wavelength, such as 532 nm. Alternatively, the light source 102 may be adapted to deliver energy between about 1 and 10 joules at a pulse width between about 8 ns and about 80 ns at wavelengths such as 748 nm and/or 1064 nm.

In addition to the light source 102 of optical system 120, a dose control system 104 may be placed between the light source 102 and the laser anneal processing chamber 121 to control the timing and amount of energy delivered to the surface of the substrate 10 during the laser annealing process. Generally, to improve the reliability and the repeatability of the energy delivered from a pulsed laser type of light source 102, the output of the pulsed laser source is continually pulsed at a desired frequency and only a fraction of the delivered pulses are allowed to pass through the dose control system 104 and make their way to the surface of the substrate 10. The dose control system 104 can thus control the delivery of a pulse of energy at a desired time to the other components in the optical system 120.

Most conventional lasers are not able to deliver a pulse that has a desirable profile, and thus each of the pulses delivered from the optical system 120 to the substrate needs to be adjusted to prevent damage to the substrate and/or optimize the pulse laser anneal process results. Optical system 120 may also include a pulse stretcher assembly 106 that is used to optimize the profile, or shape, of the delivered light energy as a function of time that is delivered to the surface of the substrate during the pulse laser annealing process.

The optical system 120 may also contain a beam homogenizer assembly 108 that is used to improve the uniformity of the spread of the energy across the square, rectangular or other shaped "image" that is to be projected within the anneal region on the surface of the substrate. In general, the beam homogenizer assembly 108 contains various optical components, such as lenses, apertures, or other optical components that are used to correct for non-uniform elements of an "image" and thus provide a more uniform distribution of energy to the annealing region on the surface of the substrate. In one embodiment, the beam homogenizer assembly 108 is positioned in the optical system 120 so that it will homogenize a composite energy pulse delivered from the pulse stretcher assembly 106.

The optical system 120 may also include a relay optics assembly 110 that contains a group of optical components that are used to direct the image that is passed from the up-stream components in optical system 120 to the surface of the substrate 10 that is positioned on the substrate supporting surface 116 (FIG. 1) positioned in the laser anneal processing chamber 121. In general, the relay optics assembly 110 contains a number of mirrors, lenses and other common optical components that allow the position, orientation and size of the image to be set so that it fills the annealing region on the surface of the substrate 10.

The beam homogenizer assembly 108 mentioned above is adapted to produce a homogeneous beam profile, i.e., a flat-top beam profile, from the non-flat beam profiles produces by lasers, such as a gaussian beam profile. For a non-coherent light source, the beam homogenizer assembly 108 would ordinarily be adequate to ensure uniform illumination of a target area from a high power light source. However, a beam homogenizer does not prevent coherence effects, such as speckle or diffraction fringes, on a target area of a coherent light beam.

A high speed beam modulator 103 may be included in optical system 120 to reduce the coherence effects of a coherent light source on a nanosecond time scale. In one embodiment of the present invention, the beam modulator 103 is positioned after coherent light source 102 and before dose control system 104. In another embodiment, the beam modulator 103 is positioned after dose control system 104 and before pulse stretcher assembly 106. In yet another embodiment, the beam modulator 103 is positioned after pulse stretcher assembly 106 and before beam homogenizer assembly 108. However, the beam modulator 103 may also be positioned at any location between light source 102 and relay optics assembly 110.

Figure 2A:
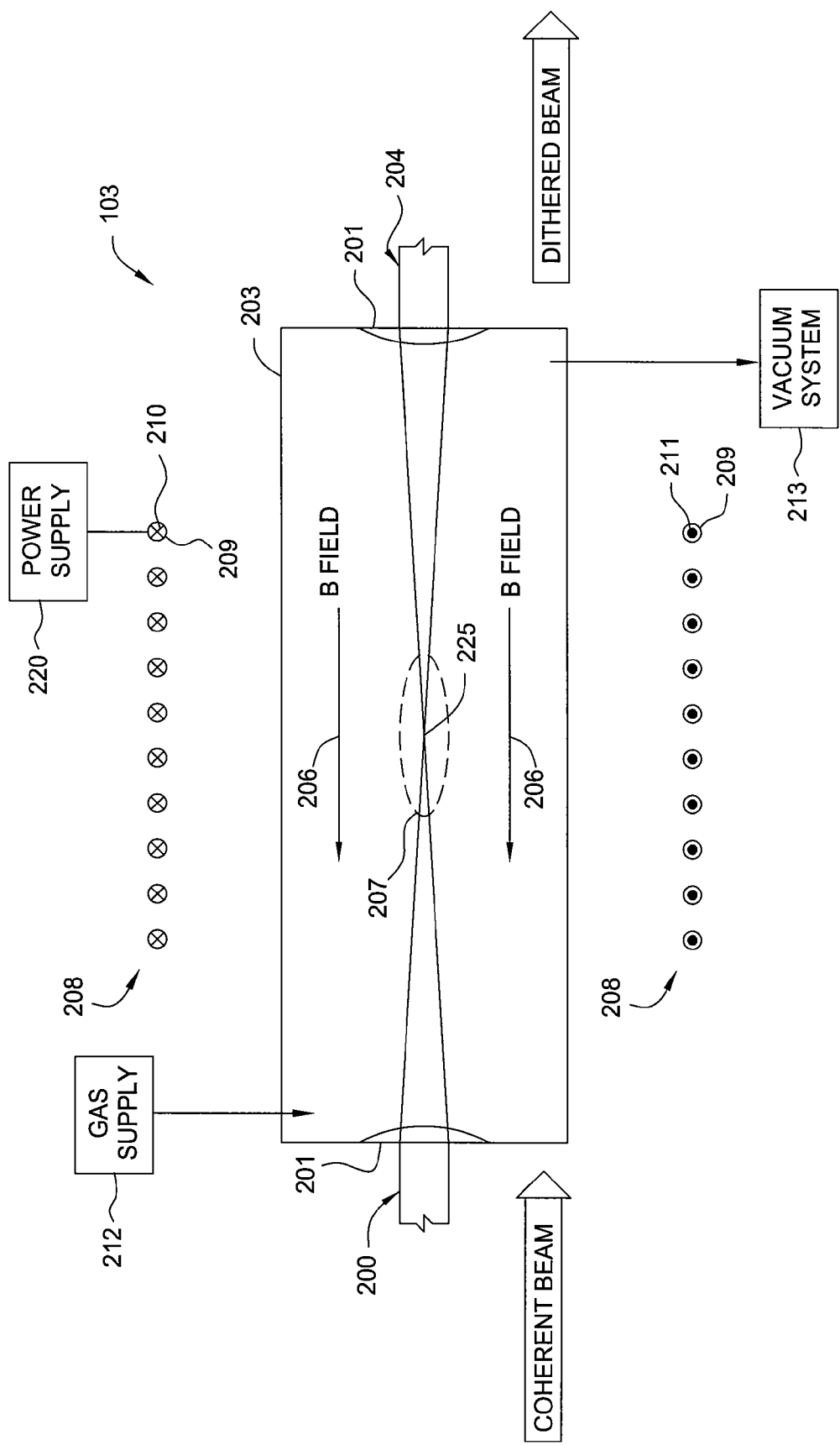
FIG. 2A illustrates a schematic view of a beam modulator according to one embodiment of the present invention.

FIG. 2A illustrates one embodiment of a beam modulator 103 apparatus that is capable of spatially modulating a coherent light pulse on the nanosecond time scale. The beam modulator 103 comprises an enclosure 203, a gas supply 212, a vacuum system 213, a solenoid 208 for generating a magnetic field, and a power supply 220 for providing current to the solenoid 208. In another embodiment, the solenoid 208 may be replaced by one or more ring magnets. In yet another embodiment, the beam modulator 103 may have no solenoid.

The enclosure 203 includes two lenses 201 which are coupled to the enclosure 203. The lenses 201 are disposed at an opposite ends of the enclosure 203 for focusing and recollimating a light beam which passes through the enclosure 203. Each lens 201 may comprise combinations of one or more lenses, such as converging and diverging lenses, which allow focusing and recollimation of a light beam. In one embodiment, each lens 201 is a converging lens (e.g., plano-convex, double-convex) which is suitably chosen to allow focusing and recollimation of the light beam. The lenses 201 are coupled to enclosure 203 to form a vacuum seal. The enclosure 203 may have the shape of a tube, but other shapes may also be used and the enclosure 203 may be made of glass, quartz, metal or other suitable materials. In one embodiment, the enclosure 203 is adapted to function as a vacuum chamber and the lenses 201 are coupled to enclosure 203 to form a vacuum seal.

A gas supply 212 is in fluid communication with and coupled to enclosure 203. The gas supply 212 may provide an inert or noble gas such as nitrogen ($N_2$), helium (He), argon (Ar) or other gases and combinations thereof to allow formation of a plasma within enclosure 203. Inert or noble gases may be used to prevent the synthesis of chemical compounds that might otherwise be created using other gases for plasma formation and which may adversely affect the optical and/or plasma characteristics of the beam modulator 103. Gas supply 212 may also include mass flow controllers or other suitable means for controlling gas flow rates.

The gas pressure within the enclosure 203 may be adjusted by valves (not shown) included in a vacuum system 213 which is in fluid communication with and coupled to the enclosure 203. The gas pressure may be adjusted to help control the plasma density and the modulation of a light beam which passes through the plasma. In one embodiment, the gas pressure may range from about 50 milliTorr to about 760 Torr.

The beam modulator 103 may also include a solenoid 208 which is disposed outside the enclosure 203. FIG. 2A shows cross sections of the solenoid windings 209 which encircle the enclosure 203. A power supply 220 provides current to the windings 209 to create a magnetic field within the solenoid 208 and inside enclosure 203. Current direction 210 (represented by "x") moves into the plane of the page and current direction 211 (represented by a dot) moves out of the plane to produce magnetic field lines 206 which have the direction shown. In another embodiment, the current direction may be reversed to reverse the direction of the magnetic field lines 206. In one embodiment, the power supply 220 is a DC power supply which may be adjusted to provide different current values and, thus, different magnetic field strengths. In another embodiment, the power supply 220 may provide a pulsed DC current. In yet another embodiment, power supply 220 may be an AC power supply.

The system controller 130 may be in communication with the beam modulator 103 and adapted to facilitate the control of the components therein. For example, the system controller 130 may be in communication with gas supply 212, vacuum system 213, and power supply 220 in order to control such beam modulator 103 parameters as gas flow rate, gas pressure, solenoid current and magnetic field strength for the beam modulator 103. The system controller 130 may also be in communication with various transducers, sensors, and optical monitors which may also be included in the beam modulator 103 and/or optical system 120 to monitor the beam modulator 103 parameters and/or a modulated beam 204 to enable automated control of the beam modulator 103 according to predetermined software instructions which may be designed to optimize beam modulator 103 performance.

The beam modulator 103 shown in FIG. 2A uses a laser produced plasma (LPP) which is "self-generated" by the laser beam to be modulated. The enclosure 203 is evacuated by vacuum system 213 to a predetermined pressure and an inert or noble gas is introduced into enclosure 203 from gas supply 212. The inert gas flow rate and vacuum pumping rate are then adjusted to provide a suitable gas pressure within the enclosure 203 prior to plasma ignition. A collimated, coherent light beam 200, such as may be produced by a pulsed laser, is directed into enclosure 203 through a first lens 201 and focused down to produce an intense light field within a small region near a focal point 225 of lens 201. When the intensity of the light field is high enough, the gas becomes ionized and a beam modulating plasma 207 is produced via an avalanche process whereby free electrons are accelerated by the incident light field causing impact ionizations of the gas atoms (or molecules) and a cascade growth in electron density. The electron density growth can be approximated by equation (1).

$$\frac{dN}{dt} = v_i N \qquad (1)$$

N is the electron density and $v_I$ is the ionization rate which is proportional to the laser intensity. In one embodiment, the radiant flux density of the coherent light beam 200 near focal point 225 ranges from about $10^7$ W/cm$^2$ to about $3.1 \times 10^{10}$ W/cm$^2$. As the coherent light beam 200 passes through and interacts with the beam modulating plasma 207, the coherent light beam 200 may be spatially modulated or dithered to produce a modulated beam 204 which then passes through second lens 201 and is recollimated and directed to other components of optical system 120.

The spatial modulation of the coherent light beam 200 by beam modulating plasma 207 may be explained by the index of refraction for a plasma which can be approximated by equation (2).

$$n^2 = 1 - \frac{\omega_p^2}{\omega^2} \quad (2)$$

Here, n is the index of refraction of the plasma, ω is the frequency of the light passing through the plasma, and $\omega_p$ is the electron plasma frequency which is shown in equation (3).

$$\omega_p = (Ne^2/\varepsilon_0 m_e)^{\frac{1}{2}} \quad (3)$$

N is the electron density of the plasma (hereafter referred to as plasma density) e is the charge of the electron, $m_e$ is the electron mass, and $\varepsilon_0$ is the permittivity of free space. Equation (2) shows that the index of refraction for a plasma is dependent upon the frequency of light ω passing through the plasma. Equation (3) can be combined with equation (2) to obtain equation (4).

$$n^2 = 1 - \frac{Ne^2}{\varepsilon_0 m_e \omega^2} \quad (4)$$

Equation (4) shows that the index of refraction of the plasma will change as the plasma density changes. A critical plasma density $N_c$ may be defined by setting the second term on the right hand side of equation (4) to 1 which results in equation (5).

$$N_c = \frac{\omega^2 m_e \varepsilon_0}{e^2} \quad (5)$$

For example, if the coherent light beam 200 has a wavelength of 532 nm, the critical density is about $3.95 \times 10^{21}$ cm$^{-3}$. Equation (4) shows that when N>$N_c$ the index of refraction for the plasma is imaginary and the plasma becomes nearly totally reflective for any light incident on the plasma. If N<$N_c$, then the index of refraction is real but less than 1 (in the absence of a magnetic field) and the incident light may be transmitted through the plasma.

Figure 2B:
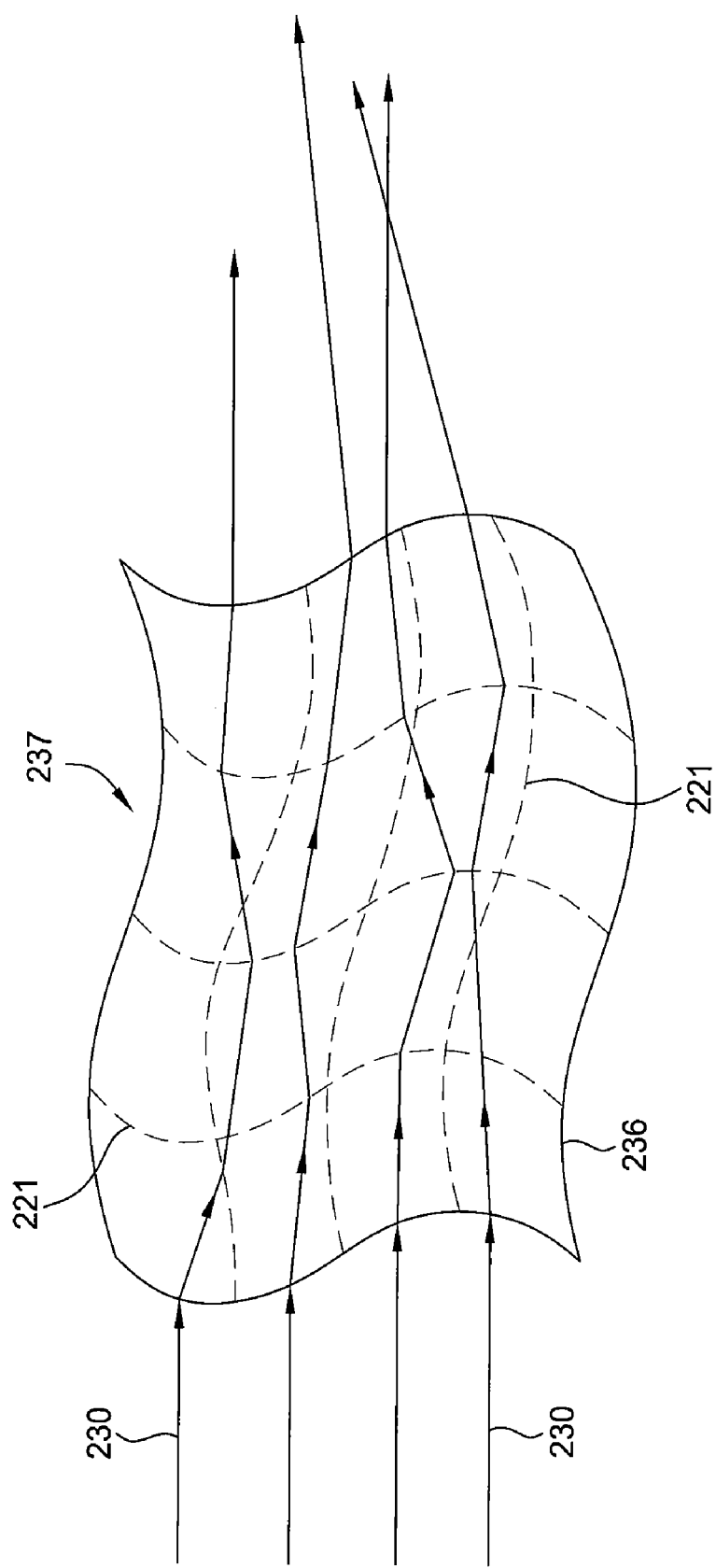
FIG. 2B is a schematic view of a plasma region within a beam modulating plasma described herein.

The plasma density may vary over time from one location to another throughout the plasma and the localized variations in plasma density may be caused by, for example, local variations in electric and magnetic fields which interact with the plasma. FIG. 2B is a schematic representation of a small plasma region 237 of beam modulating plasma 207 at one instant in time. The beam modulating plasma 207 includes many plasma regions 237. Light rays 230 with frequency ω represent adjacent portions of collimated coherent light beam 200 which are incident on the plasma region 237. The light rays 230 pass through plasma regions 237 and emerge from beam modulating plasma 207 to form adjacent portions of modulated beam 204.

The plasma region 237 is divided into cells 236 having boundaries 221, and each cell 236 has a plasma density and corresponding index of refraction which may differ from the plasma density and index of refraction of each adjacent cell 236. It is to be understood that the plasma density and index of refraction may change gradually throughout the beam modulating plasma 207 and across boundaries 221 but to simplify the discussion while retaining the essential results the boundaries 221 are treated as interfaces between different indices of refraction.

As the light rays 230 enter the plasma region 237, each light ray 230 passes through multiple cells 236 and may be reflected and refracted at each boundary 221. Only the refracted light rays 230 are shown since these are transmitted through the plasma to form modulated beam 204. The multiple refractions of each light ray 230 have the effect of randomizing the direction and optical path length of each light ray 230. This randomizing process is repeated as each light ray 230 passes through many plasma regions 237 in the beam modulating plasma 207. The randomization of optical path lengths "scrambles" the phase relationships between adjacent light rays 230 and adjacent portions of the resulting modulated beam 204.

The plasma region 237 shown in FIG. 2B represents a "snapshot" in time for the beam modulating plasma 207. As the beam modulating plasma 207 evolves in time, the relative phase relationships and directions of light rays 230 also evolve in time to effect an ongoing phase "scrambling" and direction randomization of light rays 230 to produce a "dithered" or spatially modulated beam 204. Additionally, the "self-generated" plasma produced by coherent light beam 200 implies that the beam modulating plasma 207 evolves on a time scale within the pulse width of the coherent light beam 200. For example, in one embodiment, the pulse width of the coherent light beam 200 is about 8 ns and so the beam modulating plasma 207 and, thus, the modulated beam 204 may also evolve within an 8 ns time scale. The light rays 230 may change directions and phase relationships many times within the pulse width of the coherent light beam 200. The very rapid phase "scrambling" and direction randomization of light rays 230 has the effect of rapidly and randomly shifting the position (dithering) of a speckle or fringe pattern that may be projected onto an area of the substrate 10 so that, when averaged over an appropriate time interval, such as the pulse width, the illumination of the substrate area may be uniform.

Equation (4) shows that the index of refraction for a plasma depends on the plasma density and, thus, it may be desirable to control the plasma density to avoid the case when the index of refraction for the plasma is imaginary and the plasma becomes nearly totally reflective. Additionally, for the case when the index of refraction for the plasma is real, it may be desirable to control the plasma density to optimize the spatial modulation of coherent light beam 200 while avoiding excessive losses in beam energy through scattering.

The plasma density may depend on, for example, the pressure and temperature of the gas used for plasma formation and any electromagnetic fields which may interact with the plasma. The gas pressure inside enclosure 203 may be controlled by adjusting the gas flow rate from gas supply 212 and valves within vacuum system 213. In general, the plasma density tends to increase with gas pressure. Additional adjustability in the plasma density may be provided by an external magnetic field which may help concentrate electrons along magnetic field lines. The application of an external magnetic field may also promote instabilities within the plasma which may enhance variations in plasma density on short time scales and thereby facilitate beam modulation. Here, the term "external magnetic field" is used to indicate a magnetic field which is not produced by coherent light beam 200 or beam modulating plasma 207 but is produced by an another source, such as a solenoid, which can create a magnetic field inside enclosure 203.

Figure 3A:
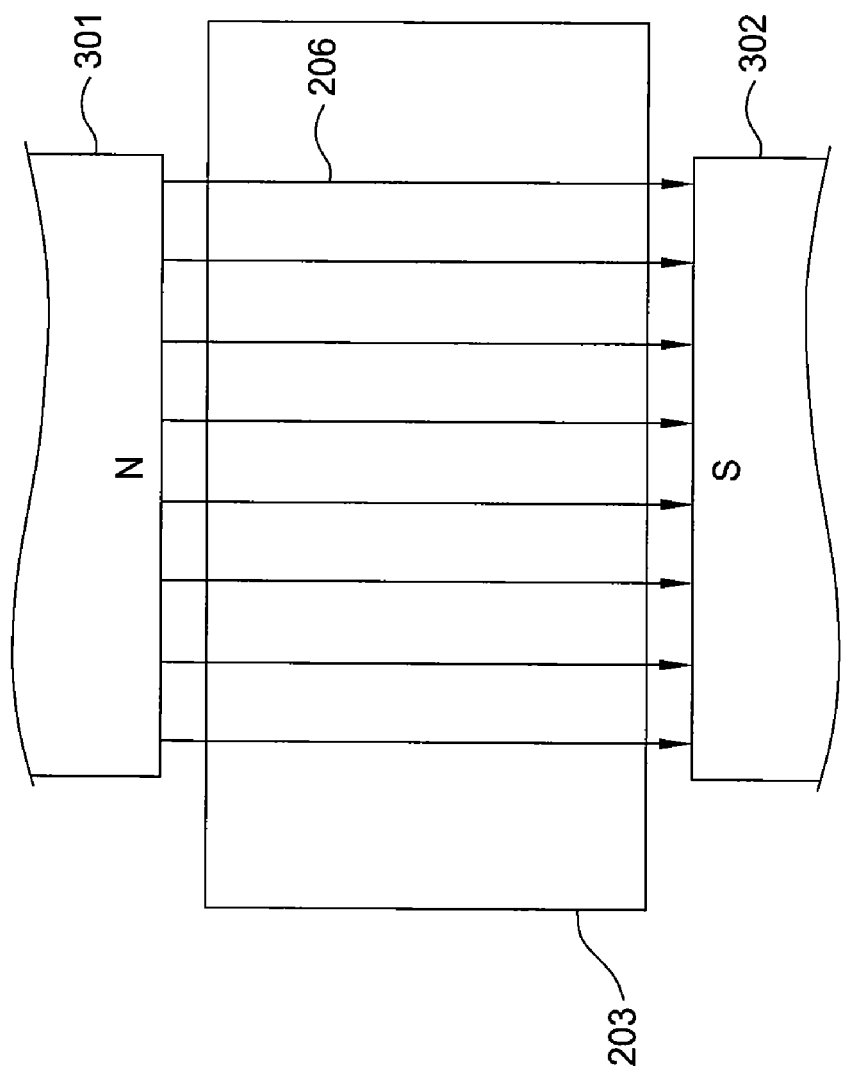
FIGS. 3A-3F illustrate schematic views for additional magnetic field embodiments described herein.

FIGS. 3A-3F illustrate schematic views of magnetic fields for embodiments described herein. FIG. 3A shows one embodiment which uses permanent magnets (e.g., bar magnets) to provide an external magnetic field which interacts with beam modulating plasma 207. A first magnet 301 and a second magnet 302 are disposed about enclosure 203 to produce magnetic field lines 206 as shown.

Figure 3B:
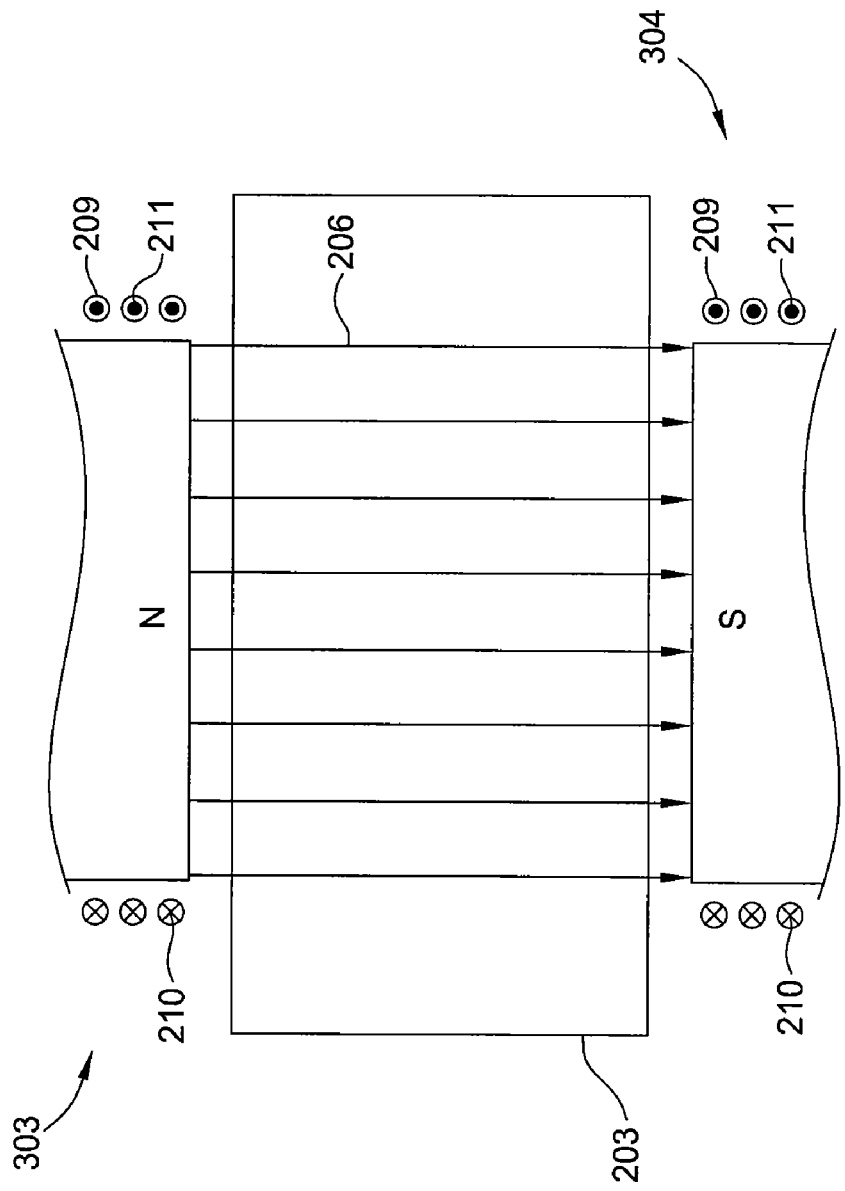

FIG. 3B shows another embodiment for a magnetic field which is produced by electromagnets 303 and 304 which are placed about enclosure 203. The windings 209 of the electromagnets 303, 304 have current directions 210, 211 which produce the magnetic field lines 206 shown. The electromagnets may include cores made of magnetizable materials, such as iron or other ferromagnetic materials, for example. In another embodiment, electromagnets 303 and 304 may be replaced by a single electromagnet which uses an open ring or toroid shaped core to produce the magnetic field lines 206 shown.

Figure 3C:
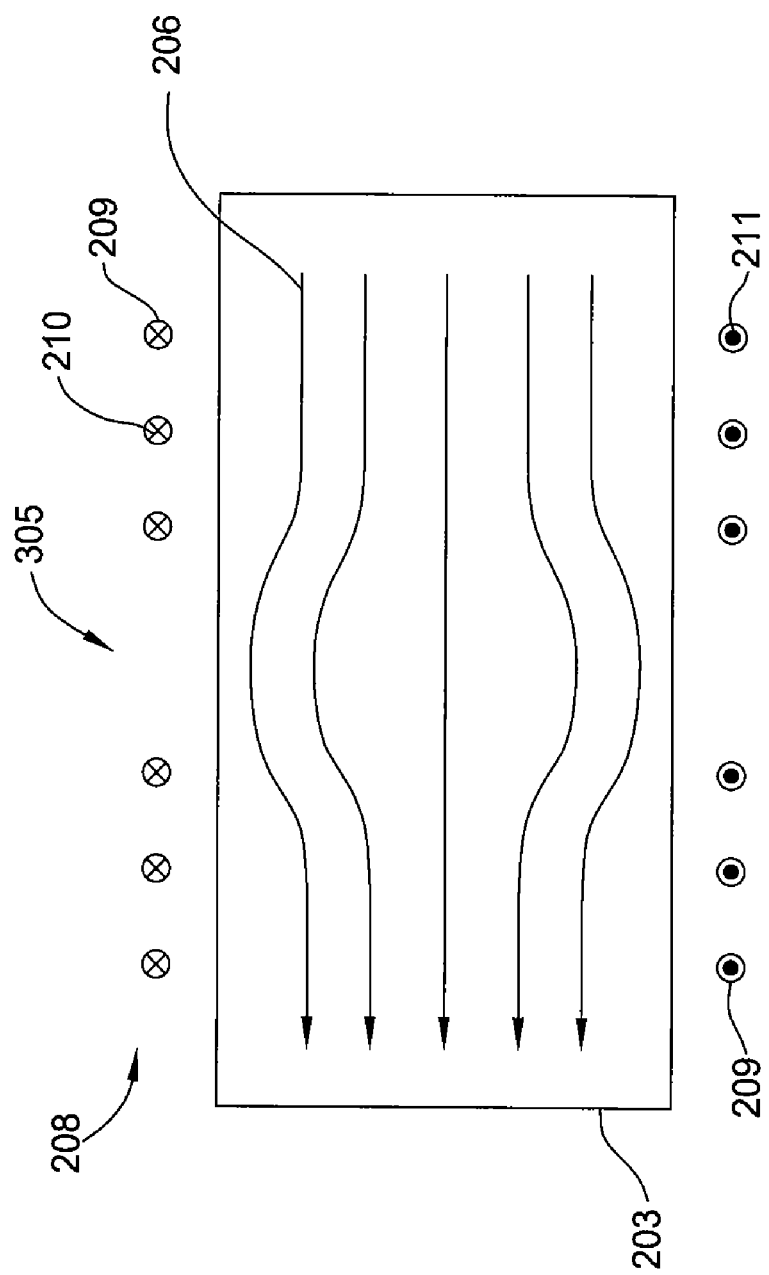
Figure 3D:
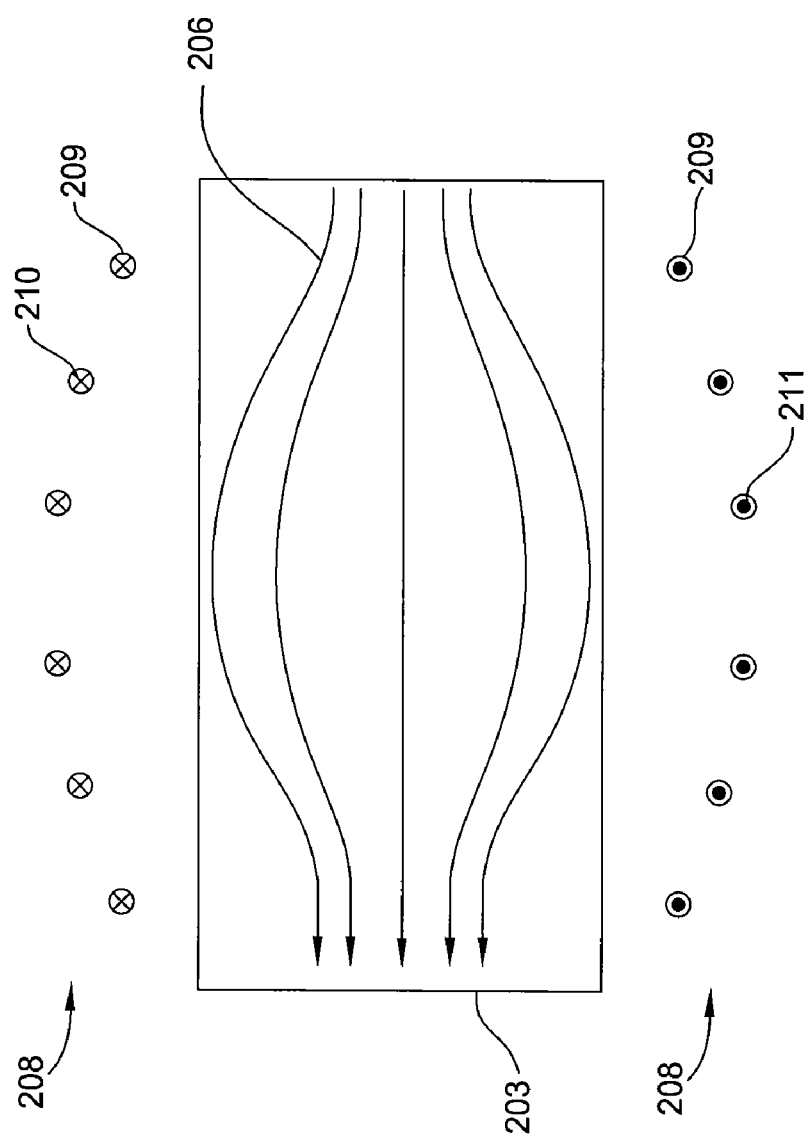

FIGS. 3C and 3D show additional embodiments for magnetic fields which use one or more solenoids 208. FIG. 3C shows one or more solenoids 208 which have a gap 305 in the spacings of the windings 209 resulting in bottle-shaped magnetic field lines 206. In another embodiment, more than one gap 305 may be used with multiple solenoids 208 to produce magnetic fields having different shapes. The bottle shape may be made more pronounced by placing the windings 209 in a spherical-type arrangement about enclosure 203 as shown in FIG. 3D. The windings 209 may also be placed in other non-linear arrangements to alter the magnetic field shape.

Figure 3E:
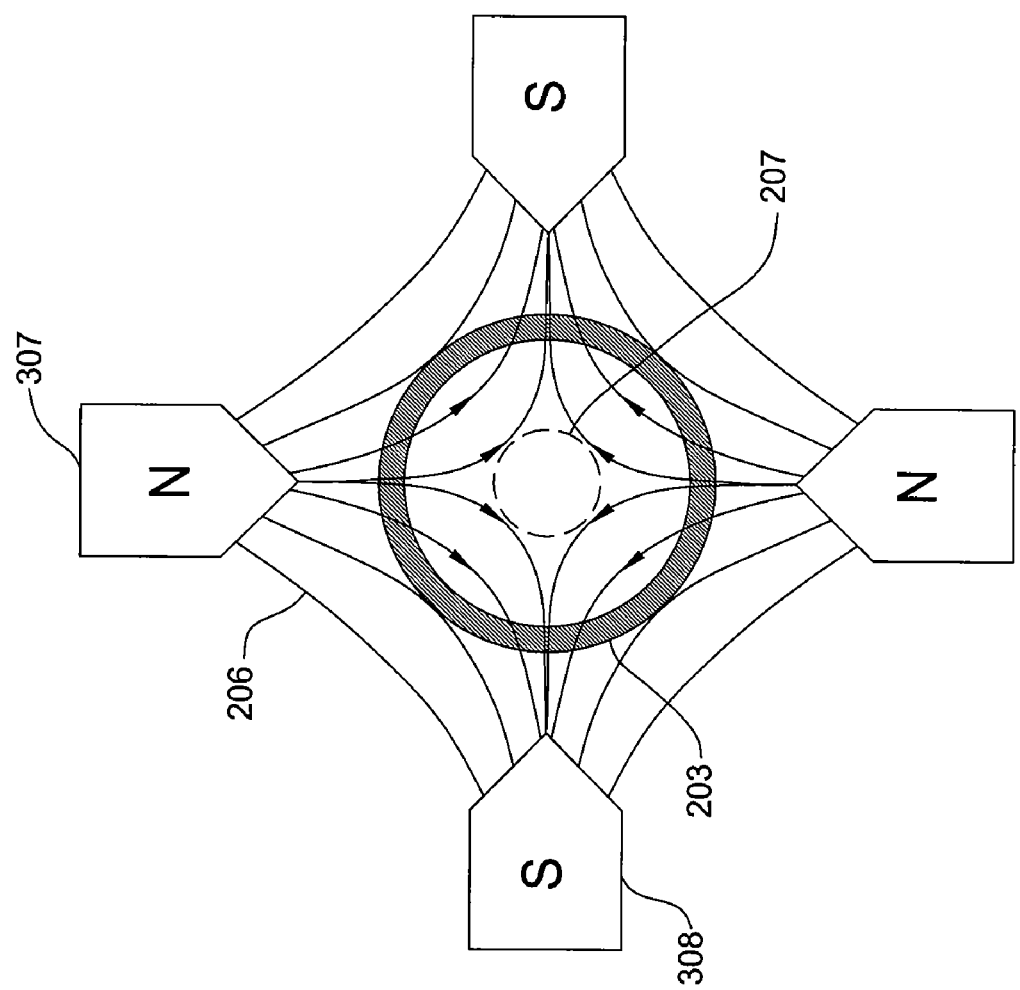

Plasma confinement and density may be enhanced by using a quadrupole magnetic field arrangement. FIG. 3E shows a cross section view of enclosure 203 and four permanent magnets 307, 308 which are disposed about enclosure 203 to produce magnetic field lines 206 of a quadrupole field. In one embodiment, the four permanent magnets 307, 308 extend along the length of the enclosure 203. In another embodiment, each of the four permanent magnets 307, 308 may be replaced by an electromagnet. In yet another embodiment, each of the four permanent magnets 307, 308 may be replaced four current-carrying wires or rods disposed along the length of the enclosure 203 wherein the currents flow in directions adapted to produce a quadrupole field.

Figure 3F:
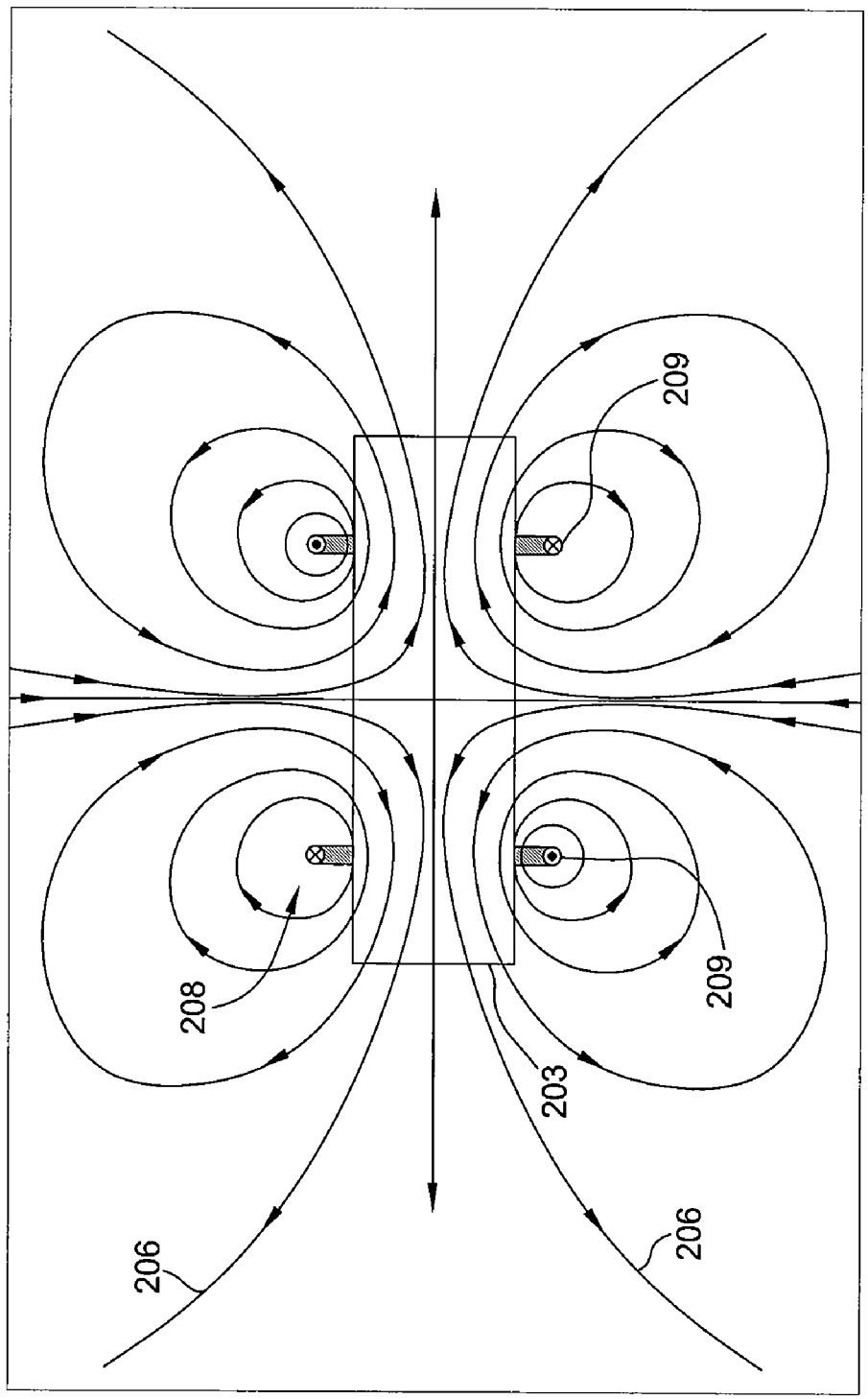

FIG. 3F shows another embodiment of a quadrupole magnetic field arrangement which uses two solenoids 208 with currents flowing in opposite directions. Although only a single winding 209 is shown for each solenoid 208, multiple windings 209 may be used for each solenoid 208. The current in the solenoids 208 may be adjusted to adjust the magnetic field strength. In another aspect of the embodiment, the solenoids 208 do not encircle the enclosure 203 but are oriented outside of the enclosure 203 to produce a magnetic field similar in cross section to that shown in FIG. 3E. The embodiments shown in FIGS. 3A-3F and described herein may be combined and used with other embodiments described herein for beam modulator 103.

Figure 4A:
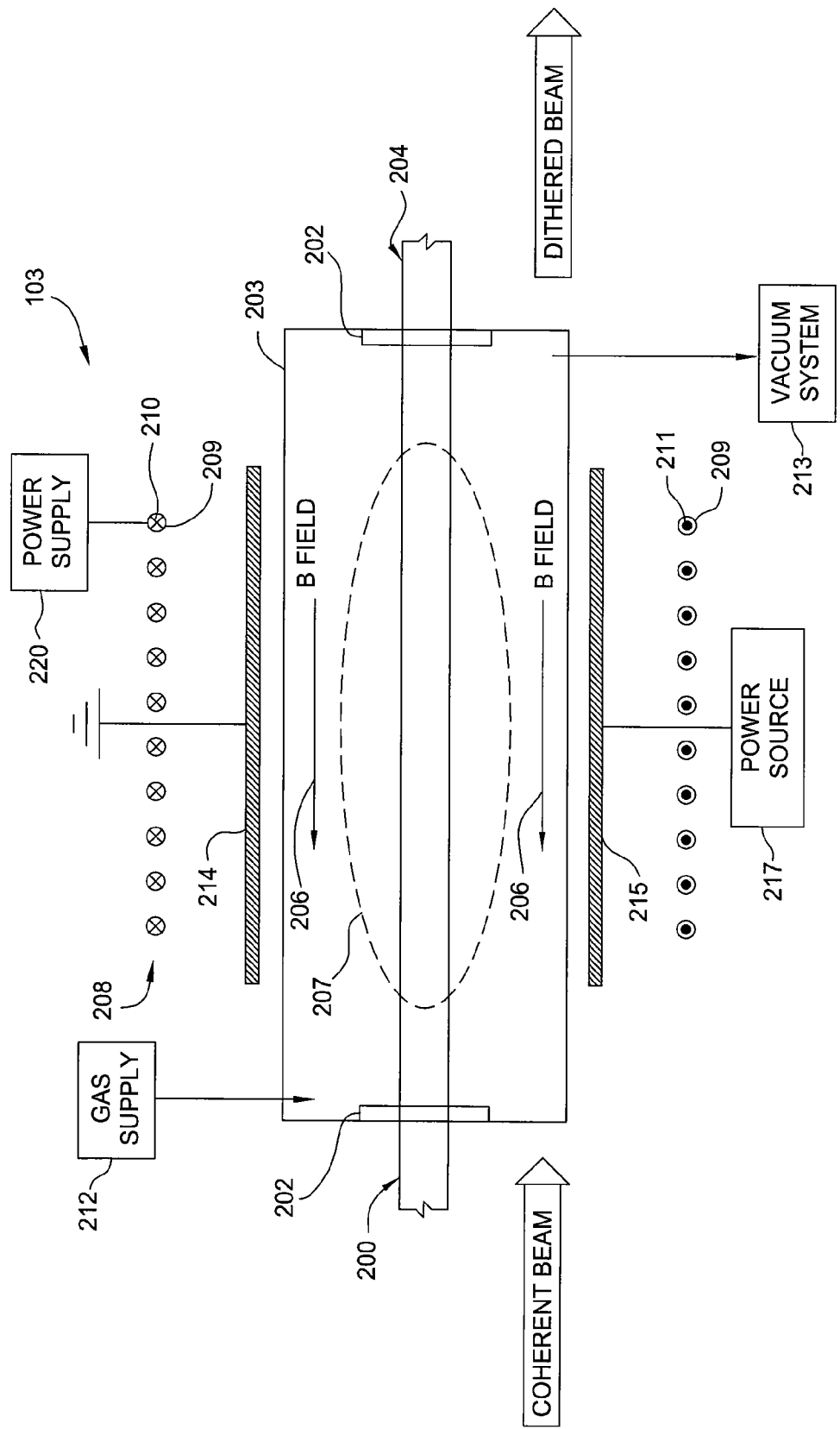
FIGS. 4A-4C are a schematic views of additional embodiments for a beam modulator described herein.
Figure 4B:
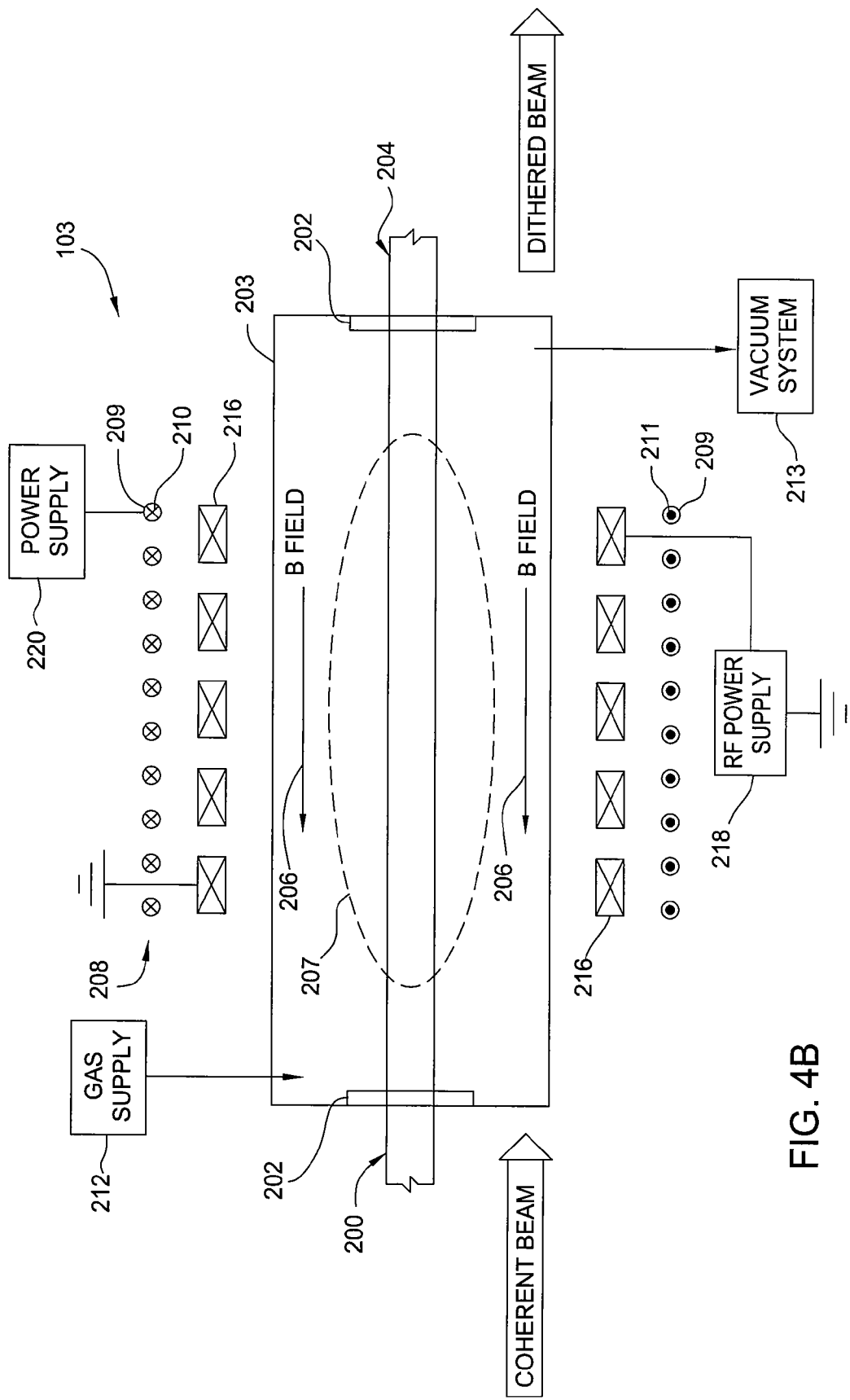
Figure 4C:
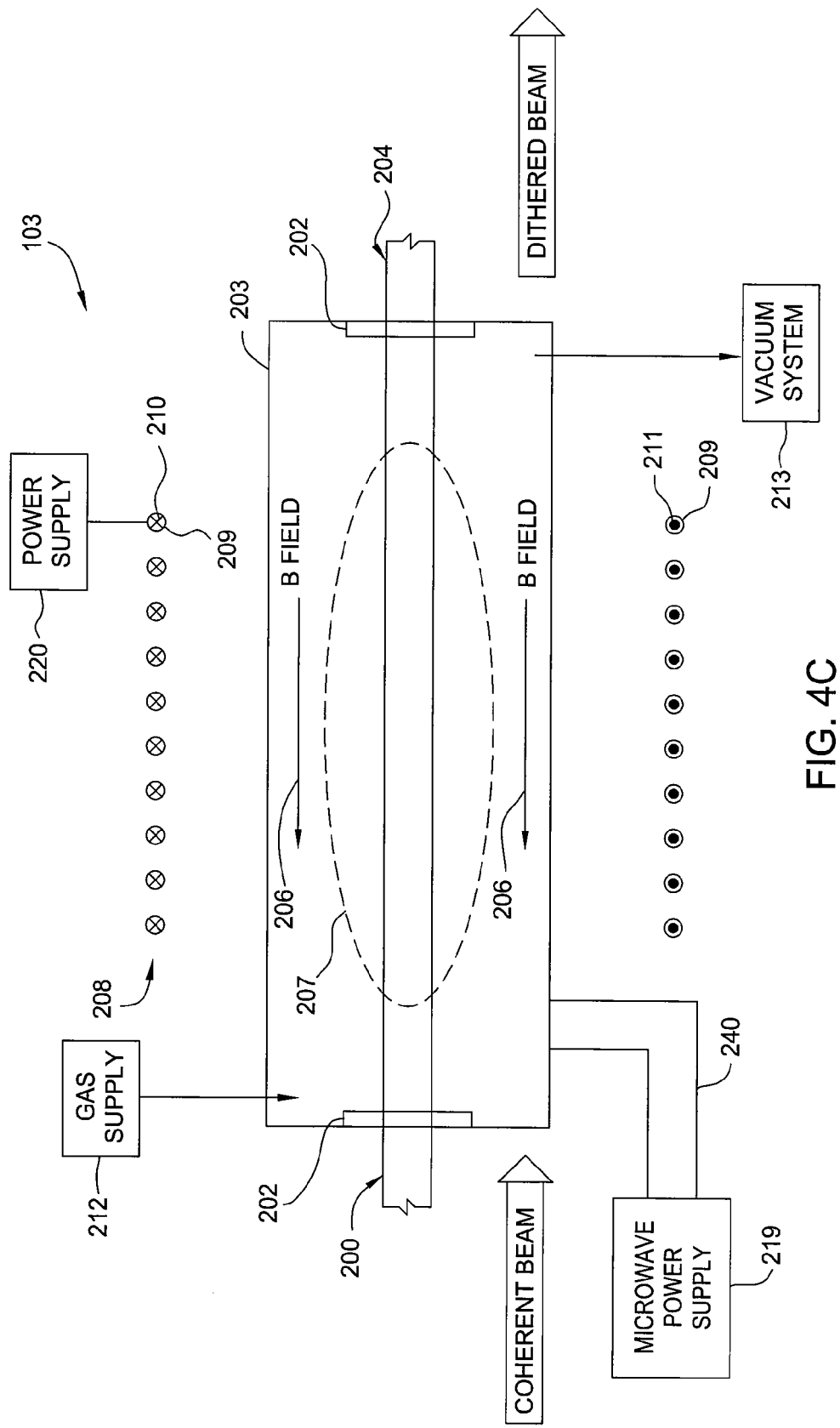

In addition to providing some adjustability in plasma density by adjusting gas pressure and a magnet field, it may be desirable to use an external plasma source for generating the beam modulating plasma 207. FIGS. 4A-4C are schematic views of different embodiments of a beam modulator 103 which uses an external plasma source instead of a "self-generated" plasma.

FIG. 4A shows a beam modulator 103 which uses a capacitively coupled plasma source. In one embodiment, a ground electrode 214 and a power electrode 215 are disposed outside of enclosure 203 and the power electrode 215 is coupled to a power source 217 which may be a DC or an RF power supply. As may be appreciated by one versed in the art, the ground electrode 214 and the power electrode 215 may have many different configurations to provide a capacitively coupled plasma. The RF power supply may operate at a frequency range of about 1 MHz to about 40 MHz, but other frequencies may be used. In another embodiment, a frequency of 13.56 MHz is used. The power source 217 may include a matching circuit (not shown) to optimize power transfer to the beam modulating plasma 207. Disposed at opposite ends of the enclosure 203 are two transmissive optical elements 202 which allow the transmission of a light beam through the enclosure 203. In one embodiment, the optical elements 202 are plates made of a suitable optically transparent material, such as glass or transparent quartz. In another embodiment, the optical elements 202 are lenses 201 which focus and recollimate the laser beam. The optical elements 202 are coupled to enclosure 203 to form a vacuum seal. The enclosure 203 may be made of a dielectric material, such as glass or quartz, so that the external ground and power electrodes 214, 215 may be effectively coupled to the beam modulating plasma 207.

The enclosure 203 is evacuated by vacuum system 213 to a predetermined pressure and an inert gas may then be introduced into enclosure 203 from gas supply 212. The inert gas flow rate and vacuum pumping rate may then be adjusted to provide a suitable gas pressure within the enclosure 203. Power is then supplied to power electrode 215 to ignite a beam modulating plasma 207. A collimated, coherent light beam 200, such as may be produced by a pulsed laser, is directed into enclosure 203 through the first optical element 202 and then passes through the beam modulating plasma 207 to produce modulated beam 204 which passes through the second optical element 202. In the embodiments shown in FIGS. 4A-4C, the optical elements 202 are transparent plates which function as windows to the laser beam.

In another aspect of the embodiment shown in FIG. 4A, the ground and power electrodes 214, 215 may be disposed inside enclosure 203. For example, the enclosure 203 may be made of a conducting material, such as metal, and coupled to a suitable ground so that the inside walls of enclosure 203 function as a ground electrode 214 and the power electrode 215 may be disposed inside enclosure 203 but electrically insulated from enclosure 203.

FIG. 4B is another embodiment of beam modulator 103 which uses an inductively coupled plasma source and may provide higher electron densities compared to a capacitvely coupled plasma source. Induction coils 216 encircle enclosure 203 and are electrically coupled to an RF power supply 218. The RF power supply 218 may operate within a frequency range of about 1 MHz to about 100 MHz but other frequencies may be used. The RF power supply 218 may include a matching circuit (not shown) for more efficient power transfer to the beam modulating plasma 207.

Another external plasma source embodiment is shown in FIG. 4C. A microwave power supply 219 is coupled to enclosure 203 by a wave guide 240. The microwave power supply 219 may operate within a frequency range of about 1 GHz to about 18 GHz, but other frequencies may be used. The microwave power supply 219 may also include a matching circuit (not shown) for more efficient power transfer to the beam modulating plasma 207. Other types of external plasma sources may also be used, such as electron cyclotron resonance produced plasmas or helicon wave plasma sources, for example. The embodiments shown in FIGS. 4A-4C and described herein may be combined and used with other embodiments described herein for beam modulator 103.

While the foregoing is directed to embodiments of the present invention, other and further embodiments of the invention may be devised without departing from the basic scope thereof, and the scope thereof is determined by the claims that follow.

The invention claimed is:

1. A beam modulator for processing a coherent light beam passing therethrough, comprising:
  an enclosure having a first lens for focusing the light beam and a second lens for collimating the light beam, wherein the enclosure is adapted to contain a gas for forming plasma between the first lens and the second lens.

2. The beam modulator of claim 1, further comprising a magnetic field apparatus for producing a magnetic field inside the enclosure.

3. The beam modulator of claim 2, wherein the magnetic field apparatus comprises a solenoid coupled to a power supply which provides current to the solenoid and wherein the power supply can be adjusted to adjust the strength of the magnetic field.

4. The beam modulator of claim 1, wherein the coherent light beam is a coherent light pulse.

5. The beam modulator of claim 1, wherein the gas is an inert gas.

6. The beam modulator of claim 1, wherein the first lens and the second lens are disposed at an opposite ends of the enclosure.

7. A beam modulator for processing a coherent light beam passing therethrough, comprising:
  an enclosure for containing a gas for plasma formation and having a first optical element and a second optical element for transmitting the light beam through the plasma within the enclosure, wherein the first optical element is a lens for focusing the light beam and the second optical element is a lens for collimating the light beam;
  a plasma source for providing a plasma inside the enclosure between the first optical element and the second optical element; and
  a magnetic field apparatus for producing a magnetic field inside the enclosure.

8. The beam modulator of claim 7, wherein the magnetic field apparatus comprises a solenoid coupled to a power supply which provides current to the solenoid and wherein the power supply can be adjusted to adjust the strength of the magnetic field.

9. The beam modulator of claim 8, wherein the solenoid is disposed outside the enclosure.

10. The beam modulator of claim 7, wherein the plasma source is a capacitively coupled plasma source or an inductively coupled plasma source.

11. The beam modulator of claim 7, wherein the coherent light beam is a coherent light pulse.

12. The beam modulator of claim 7, wherein the first and second optical element are disposed at an opposite ends of the enclosure.

13. A method for processing a coherent light beam passing therethrough, comprising:
  providing an enclosure for containing a gas for plasma formation, the enclosure having a first optical element and a second optical element being disposed at an opposite side of the first optical element;
  receiving the coherent light beam at the first optical element;
  forming a plasma between the first optical element and the second optical element;
  passing the coherent light beam through the plasma to modulate the coherent light beam; and
  receiving the modulated light beam at the second optical element.

14. The method of claim 13, wherein receiving the coherent light beam further comprises focusing the coherent light beam and wherein receiving the modulated light beam further comprises collimating the modulated light beam.

15. The method of claim 14, wherein the coherent light beam is directed through the first optical element and focused down to produce an intense light field within a region near a focal point of the first optical element, wherein the light field has an intensity that is sufficient to ionize the gas to produce the plasma.

16. The method of claim 13, further comprising applying an external magnetic field to the plasma.

17. The method of claim 13, wherein the coherent light beam is a coherent light pulse.

* * * * *

UNITED STATES PATENT AND TRADEMARK OFFICE
CERTIFICATE OF CORRECTION

| | | |
|---|---|---|
| PATENT NO. | : 7,795,816 B2 | Page 1 of 1 |
| APPLICATION NO. | : 11/868933 | |
| DATED | : September 14, 2010 | |
| INVENTOR(S) | : Jennings et al. | |

It is certified that error appears in the above-identified patent and that said Letters Patent is hereby corrected as shown below:

In the Detailed Description:

Column 9, Line 17, please delete "$\in_o$" and insert --$\varepsilon_o$-- therefor.

Signed and Sealed this
Eleventh Day of January, 2011

David J. Kappos
*Director of the United States Patent and Trademark Office*